(12) United States Patent
Kleeven et al.

(10) Patent No.: US 9,848,487 B2
(45) Date of Patent: Dec. 19, 2017

(54) HIGH CURRENT CYCLOTRON

(71) Applicant: ION BEAM APPLICATIONS S.A., Louvain-la-Neuve (BE)

(72) Inventors: Willem Kleeven, Pellenberg (BE); Eric Forton, Wallhain (BE)

(73) Assignee: ION BEAM APPLICATIONS S.A., Louvain-la-Neuve (BE)

( * ) Notice: Subject to any disclaimer, the term of this patent is extended or adjusted under 35 U.S.C. 154(b) by 0 days.

(21) Appl. No.: 14/946,530

(22) Filed: Nov. 19, 2015

(65) Prior Publication Data

US 2016/0143124 A1    May 19, 2016

(30) Foreign Application Priority Data

Nov. 19, 2014 (EP) .................................... 14193792
Nov. 4, 2015 (EP) .................................... 15192905

(51) Int. Cl.
H05H 13/00 (2006.01)
H05H 7/10 (2006.01)
G06F 17/50 (2006.01)
H05H 7/08 (2006.01)

(52) U.S. Cl.
CPC .......... H05H 13/005 (2013.01); G06F 17/50 (2013.01); H05H 7/10 (2013.01); H05H 2007/082 (2013.01)

(58) Field of Classification Search
USPC ....................................................... 315/502
See application file for complete search history.

(56) References Cited

U.S. PATENT DOCUMENTS

| | | | | |
|---|---|---|---|---|
| 4,063,125 A | * | 12/1977 | Tran ...................... | H05H 13/00 313/62 |
| 6,683,426 B1 | * | 1/2004 | Kleeven ................... | H05H 7/10 315/500 |
| 7,884,340 B2 | * | 2/2011 | Nutt ...................... | G21G 1/0005 250/493.1 |
| 8,324,841 B2 | * | 12/2012 | Kleeven ................. | H05H 13/00 313/62 |

(Continued)

FOREIGN PATENT DOCUMENTS

| EP | 1 069 809 | 1/2001 |
|---|---|---|
| EP | 2 134 145 | 12/2009 |

OTHER PUBLICATIONS

International Search Report for European Patent Application No. 14 19 3792 dated Apr. 28, 2015.

*Primary Examiner* — Douglas W Owens
*Assistant Examiner* — Srinivas Sathiraju
(74) *Attorney, Agent, or Firm* — Finnegan, Henderson, Farabow, Garrett & Dunner L.L.P.

(57) ABSTRACT

Cyclotron for accelerating charged particles around an axis, comprising an electromagnet with an upper pole and a lower pole, producing a magnetic field in the direction of said axis; a Dee electrode assembly and a counter Dee electrode assembly separated from each other by a gap for accelerating said charged particles and a pair of ion sources located in a central region of the cyclotron. Said ion sources are located at a distance of said axis such that the particles emitted from the first ion source pass between said first and second ion sources after a path of half a turn, and radially outwards of the second ion source after a path of three half-turns, and reciprocally.

10 Claims, 5 Drawing Sheets

(56) References Cited

U.S. PATENT DOCUMENTS

| | | | | |
|---|---|---|---|---|
| 8,525,448 | B2* | 9/2013 | Tanaka | H05H 7/12 250/396 R |
| 8,946,659 | B2* | 2/2015 | Abs | A61L 2/087 250/396 ML |
| 9,192,787 | B2* | 11/2015 | Dessy | A61N 5/1075 |
| 9,237,642 | B2* | 1/2016 | Kleeven | H05H 13/005 |
| 2006/0255285 | A1* | 11/2006 | Jongen | H05H 13/00 250/396 ML |
| 2008/0258653 | A1* | 10/2008 | Nutt | H05H 13/00 315/502 |
| 2009/0218520 | A1* | 9/2009 | Nutt | G21G 1/0005 250/493.1 |
| 2010/0127188 | A1* | 5/2010 | Nutt | G21G 1/001 250/491.1 |
| 2012/0217903 | A1* | 8/2012 | Tanaka | H05H 7/12 315/502 |
| 2013/0141019 | A1* | 6/2013 | Kleeven | H05H 7/04 315/502 |

* cited by examiner

HIGH CURRENT CYCLOTRON

CROSS-REFERENCE TO RELATED APPLICATIONS

This U.S. patent application claims priority under 35 U.S.C. §119 to: European Patent Application No. EP15192905.6, filed Nov. 4, 2015 and European Patent Application No. EP14193792.0, filed Nov. 19, 2014. The aforementioned applications are incorporated herein by reference in their entireties.

TECHNICAL FIELD

The present disclosure relates generally to the field of cyclotrons. More specifically, the present disclosure relates to a cyclotron having aimed at producing a high-current particle beam.

BACKGROUND

A cyclotron is a charged particle accelerator wherein particles are guided along a quasi-circular or spiral path around an axis by a magnetic field, and accelerated each time they pass an accelerating gap along their path. The particles may be produced in the central region of the cyclotron by an ion source. After a number of turns along the quasi-circular or circular path, the particle beam is usually extracted from the cyclotron for directing the beam onto a target e.g. for producing a radioisotope or other purposes. Several methods are known for extracting the particles. One such method is the stripping method: the ions produced by the source are negative ions. At the extraction region, they pass through a thin foil of material which strips off the weakly bound electrons from the ions. The emerging positively charged particles are now deflected in the opposite direction by the magnetic field and directed outside of the cyclotron. This method is efficient, but has the drawback that negative ions may be produced and accelerated. These negative ions are fragile and can lose an electron in the course of acceleration, and then produce unwanted isotopes and activate the cyclotron. In addition, strippers are very thin foils and may be destroyed by the beam, and may require maintenance.

Another method is to arrange at the periphery of the cyclotron a pair of electrodes producing an electrical field pulling the charged particles out of the cyclotron. The inner electrode, called septum, may be placed in the distance between two successive turns of the cyclotron. However, this method works when there is a sufficient separation between two successive turns at the extraction region. When the separation distance between turns is small, or the beam has some radial extension, the septum receives part of the particles and becomes activated.

Another extraction method, known as auto-extraction, is disclosed in WO0105199A1. This method is applicable to cyclotrons having azimuthally varying fields also called sector-focused cyclotrons. In these cyclotrons, the poles are divided in sectors, where the vertical gap is small, called hills, separated by sectors where the vertical gap is large, called valleys. The auto-extraction is obtained by providing a hill sector having a significantly larger radial extension. A groove or plateau, which follows the shape of the particle path, is provided in the extended part of this extended sector. The resulting local dip in the magnetic field forces the beam to exit the cyclotron. In order to ensure that coherent oscillations are such that the beam enters the groove or plateau, it is necessary to locate a first pair of harmonic coils producing opposite vertical field components at 180° from each other, and a second pair of harmonic coils also producing opposite vertical field components at 180° from each other, at 90° from the first pair. Such a pair of harmonic coils have the effect of displacing laterally the center of the quasi circular beam path. The currents in the first and second harmonic coils may be tuned in such a way that the beam enters the groove or plateau.

As an alternative to the extraction methods discussed above, the accelerated beam may be used without extraction, by locating a target receiving the beam inside the cyclotron, at the periphery of the cyclotron.

All the methods described above are adapted for cyclotrons having a single source and a single particle beam. A cyclotron having two ion sources is described in EP2196073A1. As discussed in said document, there is a need for a cyclotron having two ion sources. The ion sources described in this document may be used alternatively or simultaneously, thereby increasing either the uptime and reliability or the productivity of the cyclotron. When used alternatively, the second ion source may be used when a defect occurs in the first ion source. The second source may take over at once, with reduced downtime, and reduced need for the maintenance personnel to enter the shielded room of the cyclotron. When used simultaneously, the beam current produced may be twice as high, reaching two distinct targets. The designs described in this document are obtained by adapting a known design, discussed at paragraph 29 and represented at FIG. 4 of this document, and where one of the sources produces protons and the other source produces deuterons. These two different sources are replaced by two identical sources. As can be seen on said FIG. 4, the ions produced by one source hit the backside of the other ion source and the beam is lost during the first turn. Two solutions to this problem are proposed:
  (i) ion sources having a special design, including a notch, have been designed.
  (ii) the two ions sources are shifted towards the center bringing them in the closest geometry that is technical possible in view of the dimensions of the ion sources.

Although these two solutions allow the design orbit emitted from one source to pass radially outwards of the other source at the first half-turn, these solutions have disadvantages:
  (i) the sources having a notch are more complex to produce and more fragile
  (ii) when shifting the sources towards the center, the gap between the sources and the Dee electrode is not optimal. E.g., the electric field lines may not be optimal for accelerating particles, or for a given voltage between source and Dee, the electric field may be very high and lead to breakdowns.

Moreover, said document does not address the problem of extraction of the two beams. The auto-extraction discussed above will not work with this twin source design, because the harmonic coils will have the desired effect for one of the beams, but will not be able to direct both beams simultaneously.

The present disclosure aims to provide a cyclotron which overcomes the problem of the prior art. In particular, it is an object of the present disclosure to provide a twin ion source cyclotron capable of producing high beam currents, low beam losses, with robust ion sources.

SUMMARY

Disclosed embodiments are described by the claims. The dependent claims further describe advantageous embodiments.

According a first aspect of the disclosure, there is provided a cyclotron for accelerating charged particles around an axis, comprising an electromagnet with an upper pole and a lower pole, producing a given magnetic field in the direction of said axis; a Dee electrode assembly and a counter Dee electrode assembly separated from each other by a gap and submitted to a given accelerating voltage for accelerating said charged particles; a pair of ion sources located in a central region of said cyclotron. Said electromagnet, Dee electrode assembly and sources are adapted for producing charged particles along paths in said cyclotron. Said ion sources are located at a distance of said axis such that the particles emitted from the first ion source pass between said first and second ion sources after a path of half a turn, and radially outwards of the second ion source after a path of three half-turns, and the particles emitted from the second ion source pass between said second and said first ion source after a path of half a turn, and radially outwards of the first ion source after a path of three half-turns. By putting the sources at such a radial distance, coherent horizontal betatron beam oscillation are obtained that gives the needed turn-separation at the peripheral region of the cyclotron so that either extraction or the use of an internal source is easier. It is observed that this result can be obtained by locating the sources at a larger radial distance than in prior art cyclotrons.

In some embodiments, said poles, said Dee electrode assembly, said counter Dee electrode assembly and said sources have a two-fold axis of symmetry.

The poles may comprise two short hill sectors and two extended hill sectors, the extended hill sectors having a larger radial extent than the short hill sectors and having a groove or plateau at their extended region, which follows the shape of the path of charged particles, such that the magnetic field decreases at a shorter radial distance in the extended hill sectors than in the short hill sectors. After this decrease the magnetic field may remain significant along the length of the groove or plateau, and then decrease again at the radial end of the sector. This is the embodiment of the disclosure where the cyclotron is a "deep valley" cyclotron, with autoextraction.

A gap exists between the hill sectors of the upper pole and the lower pole. In come embodiments of the disclosure when using autoextraction, in the hill sectors, said upper and lower poles are shaped such that said gap is constant along a path of said charged particles (iso-gap paths). As a result of this feature, a beam experiences a nearly constant magnetic field in the last turn of the path, and a reduced magnetic field in the groove or plateau region, with a sharp fall-off of the field between the two regions.

A beam separator may be provided radially inwards of a path of the charged particles having passed along the groove or plateau. Thereby, only the particles having the right direction continue their path, and the activation of the cyclotron by wrong-directed particles is minimised.

The short hill sectors and/or the long hill sectors may have an azimuthal extent comprised between 40° and 50°, typically 45°.

When the cyclotron is an autoextraction cyclotron, the ion sources may be located at a radius and an azimuthal angle and oriented such that the beam emitted therefrom enters one of said long hill sectors at a radial distance of said groove or plateau.

According a second aspect, the disclosure relates to the use of a cyclotron according to the disclosure for producing two particle beams from the two ion sources simultaneously, and directing said two beams to two targets. A high productivity can thus be obtained.

According a third aspect, the disclosure relates to the use of a cyclotron according to the disclosure for producing one particle beam from one of the two ion source, and in case of default of said one ion source, producing one particle beam from the other of said two ion sources. Thereby, the production can continue without disruption in case of default of a first ion source. The need to enter a shielded vault and to open the cyclotron for maintenance is minimised.

According a fourth aspect, the disclosure relates to a method for designing a cyclotron comprising an electromagnet with an upper pole and a lower pole, producing a magnetic field, a Dee electrode assembly and a counter Dee electrode assembly separated from each other by a gap and submitted to a accelerating voltage for accelerating said charged particles. The method comprises the steps of (a) selecting a value for said magnetic field and said accelerating voltage;
(b) selecting a radial position r for a pair of ion sources;
(c) computing the path of the particle beam emitted by each one of said ion sources; and
d) repeating steps a), b) and c) until a radial position r is found where particles emitted from one of said ion source pass between said ion source and the other ion source after a path of half a turn, and radially outwards of the other ion source after a path of three half-turns, and reciprocally.

In an embodiment, the method, applicable to autoextraction cyclotrons, comprises the step of (a) selecting an azimuthal position for said pair of ion sources; (b) selecting an orientation for said pair of ion sources, said orientation being the direction in a plane perpendicular to said axis of a plane of the source wherefrom the beam exits perpendicularly; (c) computing the path of the particle beam emitted by one of said ion source; and repeating steps a), b) and c) until an azimuthal position and an orientation are found where particles emitted from said one ion source enter one of said extended hill sectors at a radial distance of said groove or plateau.

The method may also comprise the steps of (a) determining the centres C and radiuses r' of circles fitting the shape of successive closed orbits; and (b) shaping the poles of the hill sectors, such that the pole gap is constant along these circles. According to this method, a cyclotron with iso-gap paths is obtained, and a sharp field fall off is obtained between the last orbit, and the extraction orbit.

DETAILED DESCRIPTION

The disclosure provides a cyclotron for accelerating charged particles around an axis, comprising an electromagnet with an upper pole and a lower pole, producing a magnetic field in the direction of said axis; a Dee electrode assembly and a counter Dee electrode assembly separated from each other by a gap for accelerating said charged particles; a pair of ion sources located in a central region of said cyclotron. Said ion sources are located at a distance of said axis such that the particles emitted from the first ion source pass between said first and second ion sources after a path of half a turn, and radially outwards of the second ion source after a path of three half-turns, and the particles emitted from the second ion source pass between said second and said first ion source after a path of half a turn, and radially outwards of the first ion source after a path of three half-turns. By putting the sources at such a radial distance, coherent horizontal betatron beam oscillation are obtained that gives the needed turn-separation at the peripheral region of the cyclotron so that either extraction or the use of an internal source is easier. It is observed that this result can be obtained by locating the sources at a larger radial distance than in prior art cyclotrons.

Figure 1:
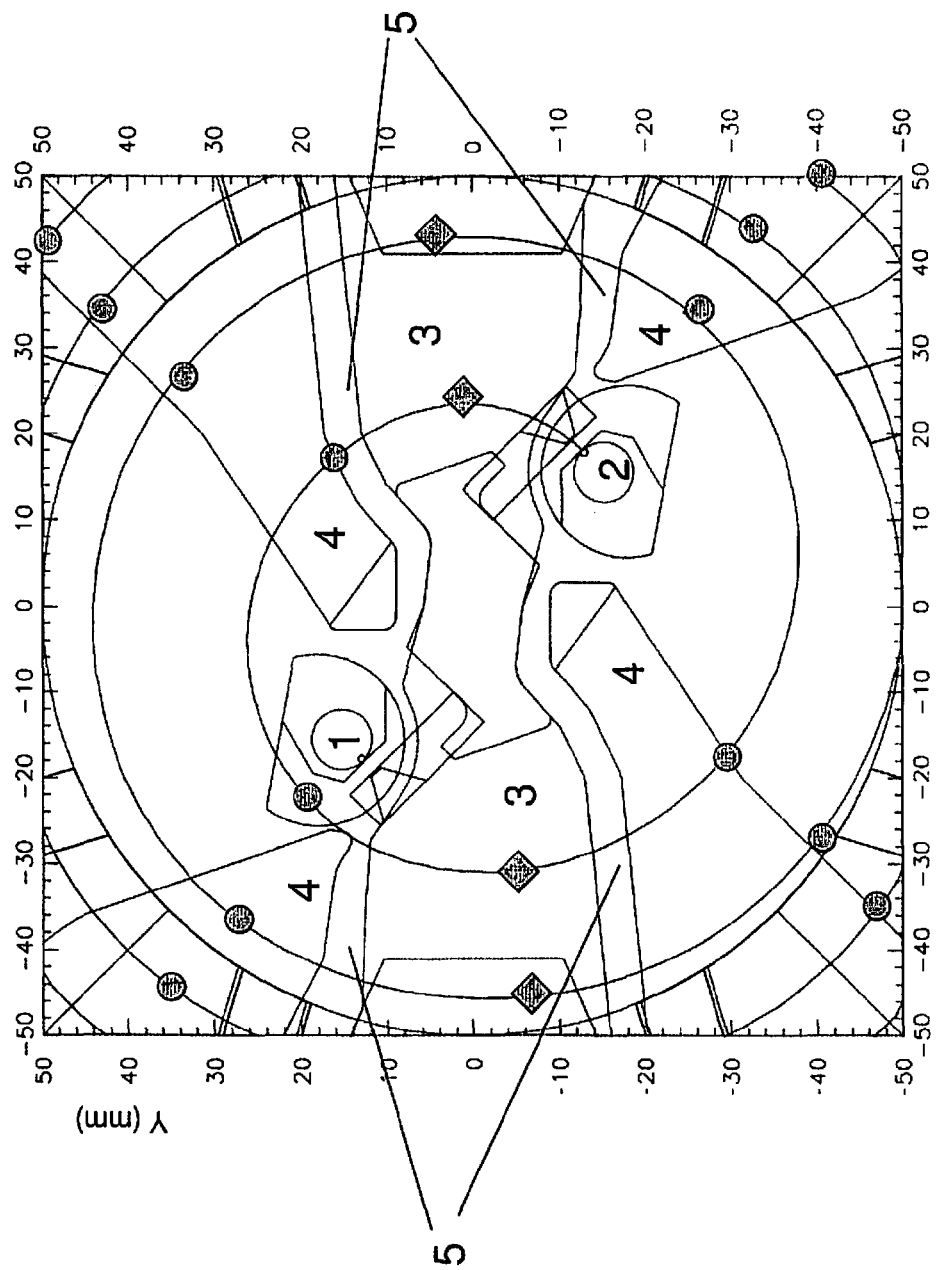
FIG. 1 is a top view of the central region of a cyclotron of the prior art, according to EP2196073.

FIG. 1 is a view of the central region of a cyclotron according to the prior art discussed above in relation to EP2196073A1. The two ions sources 1 and 2 are located as close to the center as possible. Dee electrodes 3 and counter Dee electrodes 4 are connected to a high frequency voltage source, and produce an accelerating electric field across gaps 5. The plain circles and the plane squares represent the position of the protons at the moment when the Dee voltage 3 is maximum and zero, respectively. The path of the particles emitted by the second ion 2 source passes radially outward of the first ion source 1 after the first half turn.

Figure 2:
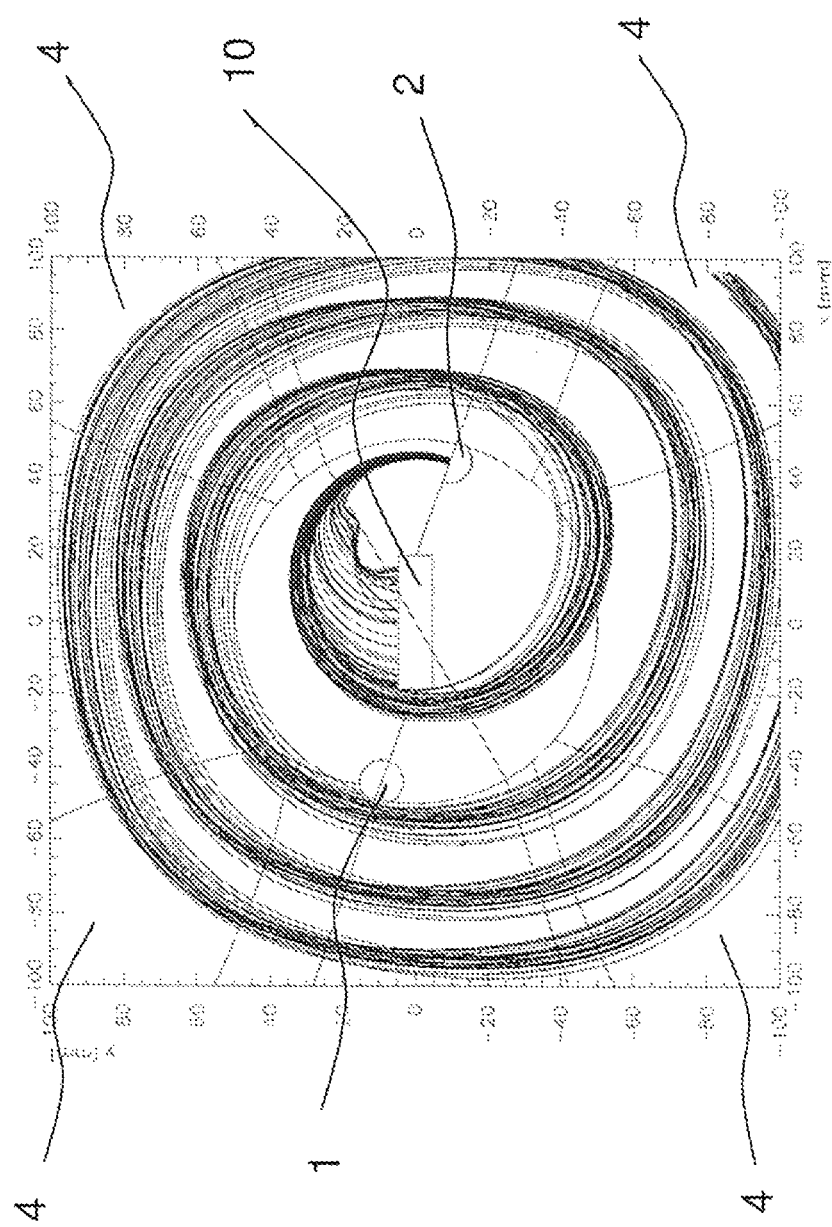
FIG. 2 is a top view of the central region of a cyclotron according to an embodiment of the disclosure.

FIG. 2 is a view of the central region of a cyclotron according to the disclosure, where same components have same reference number as in FIG. 1. As shown, the path of the particles emitted by the second ion 2 source passes radially inward of the first ion source 1 after the first half-turn, and outward after three half-turns. A central region beam collimator 10 is located between the two ion sources 1 and 2. This central region beam collimator 10 stops and absorbs a fraction of the beam emitted by the ion sources that is not along the desired path. This central region beam collimator 10 may be a block connecting two opposite counter Dees (not represented in this figure). FIG. 2 has been obtained by performing a calculation with the following conditions, using the geometry and acceleration field and magnetic field design of the C14 cyclotron produced by the applicant:

| | |
|---|---|
| Number of particles: | 3000 |
| Energy at source: | 100 eV |
| RF-phase: | $0° < \Phi_{RF} < 110°$ |
| Source slit: | 2 mm width × 4 mm height |
| Horizontal emittance: | 500 p mm-mrad |
| Horizontal half-beam width: | 1 mm |
| Horizontal divergence: | 500 mrad |
| Vertical emittance: | 500 π mm-mrad |
| Vertical half-beam width: | 2 mm |
| Vertical divergence: | 250 mrad |

Figure 3:
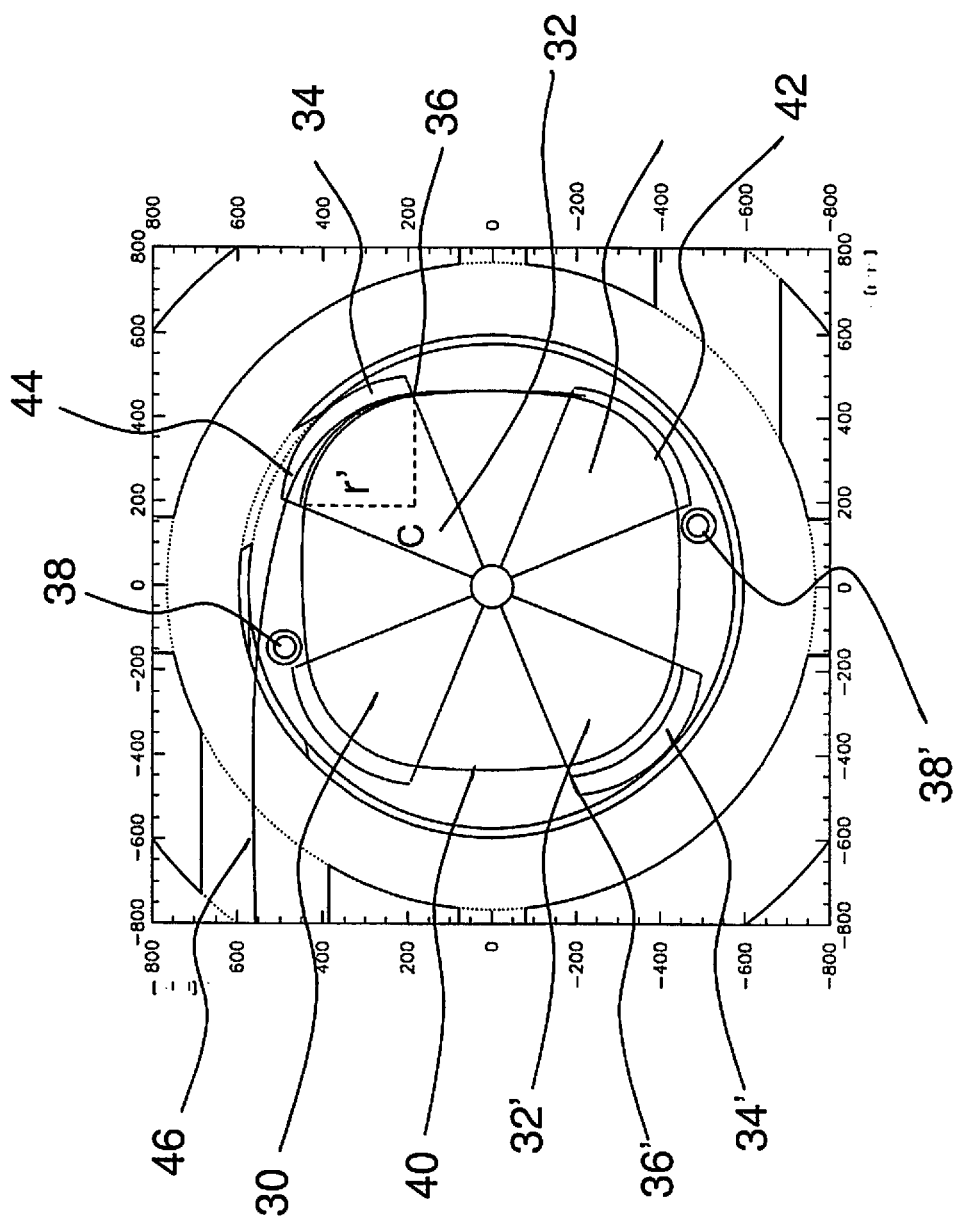
FIG. 3 is a top view is a top view of a cyclotron according to some embodiments of the disclosure, where beam extraction is performed by auto-extraction.

A similar set of particles, rotated 180° with respect to the set of particle paths shown, can be emitted simultaneously by ion source 1.
The selection of the radial position of the ion sources, farer from the center than in the prior art twin source cyclotrons, creates a coherent horizontal betatron beam oscillation that gives the needed turn-separation at extraction FIG. 3 is a top view of view of a cyclotron according to an embodiment of the disclosure, where beam extraction is performed by auto-extraction. Two short hill sectors 30, 30' and two extended hill sectors 32, 32' are located symmetrically around an axis of symmetry. In the exemplary embodiment, the short hill sectors 30, 30' have a radius of 54 cm, and the extended hill sectors 32, 32' have a radius of 57 cm. The extended hill sectors 32, 32' have at their extended region, a groove or plateau 34 and 34'. The particles, arriving at the entrance 36, 36' of these grooves or plateaus, experience a reduced vertical magnetic field. As a consequence, the radius of curvature of their path is reduced, and they are directed out of the acceleration region of the cyclotron. Exit region beam separator 38, 38' may be provided for intercepting that part of the particles exiting the groove or plateaus 34, 34' which would otherwise reenter the acceleration region. Both the short hill sectors 30, 30' and the extended hill sectors 32, 32' have an azimuthal extent of about 45°. The beam path, not represented in the central region for clarity reasons comprises in the peripheral region parts of the beam path in valley region 40, in the hill region 42, and in the plateau or groove region 44, and the extracted beam 46. The beam path 40 in the low magnetic field valley sectors has a nearly straight or large radius curvature. The beam path 42 in the high magnetic field hill sectors has a nearly circular curvature with a radius shorter than the radial position of the beam and a center located between the beam and the axis of the cyclotron, as represented by C and r'.

Figure 4:
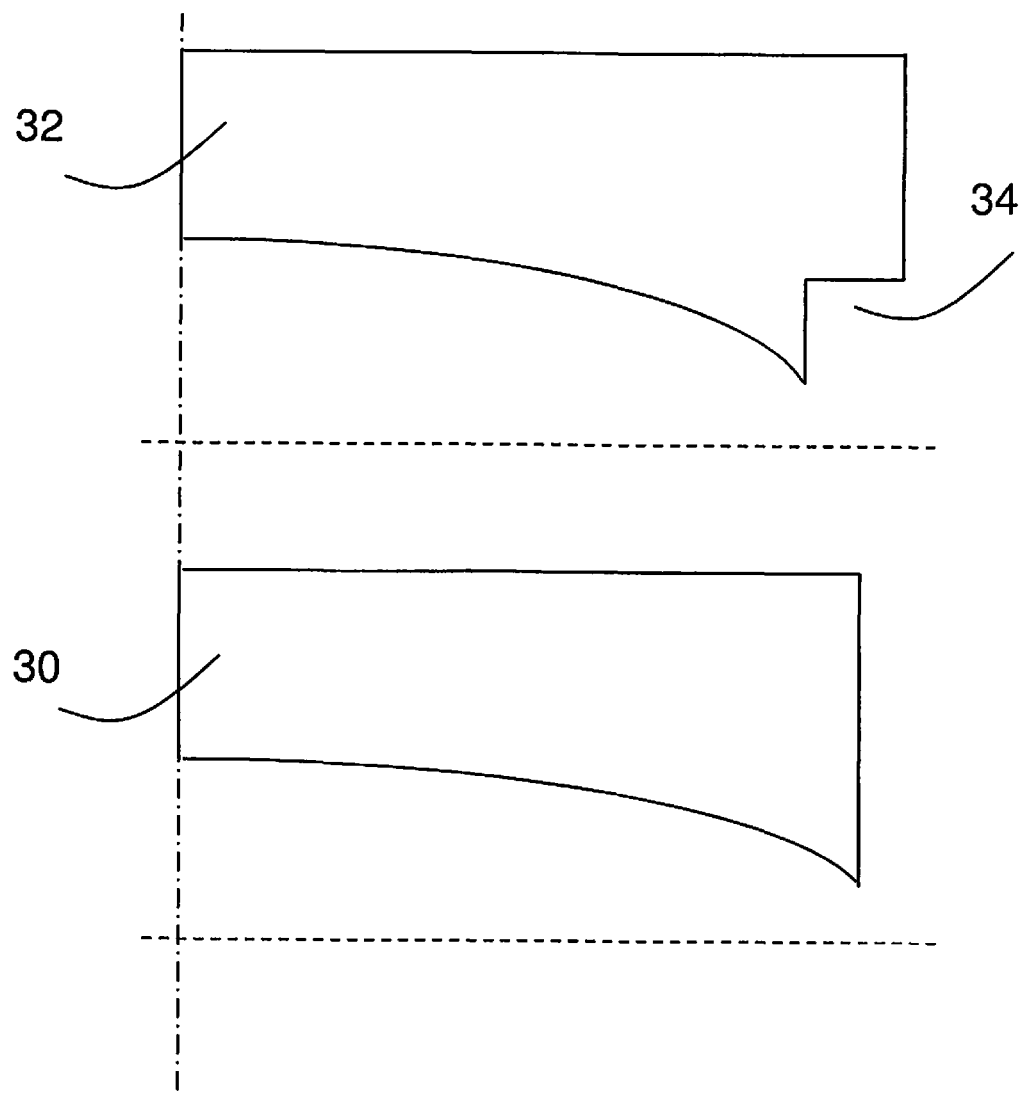
FIG. 4 is an axial section of sectors of the upper poles of a cyclotron according to an embodiment of the disclosure of FIG. 3.

FIG. 4 is an axial section of sectors of the upper pole of a cyclotron according to an embodiment of the disclosure of FIG. 3. Short hill sector 30 and extended hill sector 32, with plateau 34 are represented, above a median plane of the cyclotron, represented as a dotted line. As is well known, the pole gap, i.e. the vertical distance separating the upper sectors from the lower sectors (not represented), is decreasing radially in an elliptic curve. This facilitates the isochronicity of the cyclotron up to the extraction radius. FIG. 4 shows this elliptical decrease of the pole gap in the radial direction, both for the short hill sectors 30 and the extended hill sectors 32.

As discussed above, in an isochronous cyclotron where the magnetic field is created by hills and valleys, the static equilibrium orbit (i.e. an un-accelerated closed orbit) is not a simple circular orbit, but it is a periodic and scalloped orbit where the radial extension is large in the hills (high-field sectors) and small in the valleys (low-field sectors). In the high-field sectors, the orbital arc 42 can be well-fitted by a circular arc. However this circular arc is not centered on the center of the cyclotron. Instead it is centered in a point C such that the radius r' of the fitted circle is smaller than the average radius of the closed orbit. In an embodiment of the disclosure, in order to maximize the separation between the last internal orbit 42 just before the groove or plateau, and the extracted orbit 44 that exits via the groove or plateau, the pole-gap profile is such that this gap is constant on the fitted circle (instead of the average circle which is centered at the cyclotron center). In such a way, the strong radial gradient introduced by the groove (or plateau) acts with the same strength all along the extraction path. The last turn experiences a high field in the hill sectors, and the next turn experiences the lower field in the plateau or groove region. We denote such a pole profile as an iso-gap profile. The design of these pole-shapes may be obtained by determining the centers C and radii r' of circles fitting the shape of successive closed orbits (i.e. constant energy orbits), and shaping the poles in such a way that the pole gap is constant along these orbits.

Figure 5:
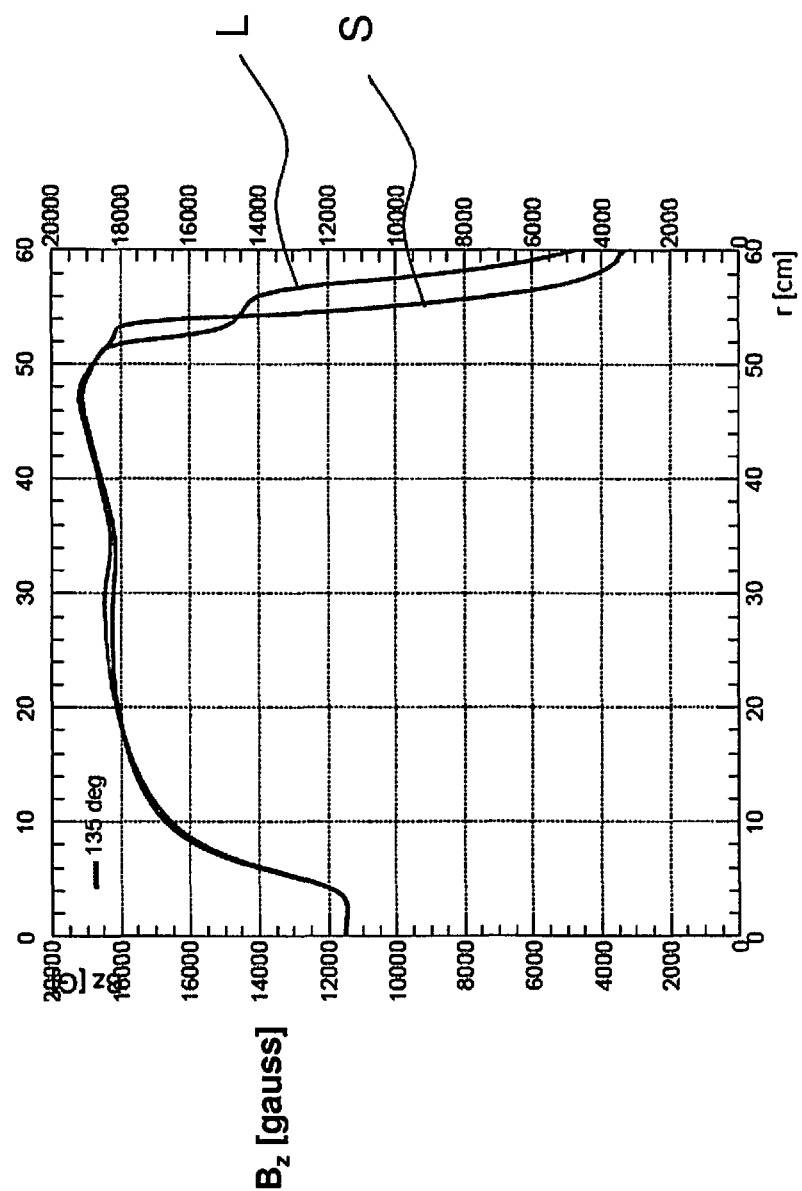
FIG. 5 is a representation of the axial magnetic field $B_z$ in gauss, in the median plane and along the radius of the cyclotron of FIG. 3.

FIG. 5 is a representation of the axial magnetic field $B_z$ in gauss, in function of the radius, along a bisecting line of a short hill sector S, and an extended hill sector L. It can be seen that the magnetic field L of an extended hill sector experiences a sharp falloff at a radius of about 52 cm with a plateau up to about 56 cm and then a sharp decrease. The magnetic field of the short hill sector S remains high along the full useful region of the pole.

As is well known in the art of cyclotron design, a new design may be obtained from a known starting point by adapting certain features. In doing so, software packages such as Opera-3D and Tosca may be used for modelling the effect of the new parameters without involving the costs of producing a real machine. These packages can compute the magnetic field produced by the shape and material of the magnet, and the electric field produced by the Dee and counter Dee electrode assembly submitted to an accelerating voltage. Having selected these design choices, it is a simple matter to compute the path of a charged particle having any initial position and momentum in the median plane of the cyclotron. The design methods of the disclosure may use these tools for iteratively finding the parameters of a cyclotron meeting design goals.

For obtaining the source position and orientation producing the best effects of the disclosure, an iterative calculation was performed. Three parameters influence the desired result, i.e that a turn separation exists at the extraction region, and in the case of autoextraction, that the beam enters the extended sectors at the right point. 36, 36' These parameters are r, the radius at which the sources are located, θ, the azimuthal angular position of the source, measured in a clockwise direction from the x-axis on FIG. 2, and a, the orientation of a plane of the source wherefrom the beam exits perpendicularly, also measured in a clockwise direction from the x-axis on FIG. 2. A search was performed in the range $$20 \text{ mm} < r < 50 \text{ mm}$$

$$-16° < \theta < -8°$$

$$-32° < \alpha < -14°$$

A software package calculated the path of the accelerated particles described at paragraph 15, in the magnetic field and acceleration field of a cyclotron. For each parameter set, the ratio of the number of particles entering the extraction region to the initial number of particles emitted by the source, i.e. 3000 particles with slightly different initial parameters, is computed. An optimal extraction ratio was found for the following values of the parameters:

$$r=45 \text{ mm}$$

$$\theta=12°$$

$$\alpha=20°$$

These values were obtained in the geometry and field design of the C14 cyclotron produced by the applicant. As will be understood, different values may be obtained in different geometries and field designs. In the prior art C14 design, the single source is located at a radial position of 24 mm. In the disclosure, the two sources are located at a larger radial distance, which produces the desired effect that the particles emitted from the first ion source pass between said first and second ion sources after a path of half a turn, and radially outwards of the second ion source after a path of three half-turns, and reciprocally.

Using the central region design of the disclosure, coherent beam oscillation are obtained at the periphery of the cyclotron. Therefore an efficient auto-extraction may be obtained without requiring harmonic coils. This is important, because harmonic coils could not be designed for treating a twin-source, twin-beam cyclotron. Using the cyclotron of the disclosure, a much higher beam current may be obtained, with less beam losses. The cyclotron according to the disclosure may be used for the production of Fluorine 18, for obtaining FDG. Also technetium-99m can be produced by bombarding a molybdenum-100 target with the 22 MeV protons following the reaction $^{100}\text{Mo}(p,2n)^{99m}\text{Tc}$. Any isotope obtainable through a proton beam in the range of 10 MeV to 30 MeV can be produced using the cyclotron of the disclosure.

The terms and descriptions used herein are set forth by way of illustration only and are not meant as limitations. The example above describes an autoextraction cyclotron. However, the disclosure applies as well to a cyclotron with internal targets. The example above describes a cyclotron with internal sources. However, the disclosure applies as well to a cyclotron having external sources where the particles are guided to the central region with an inflector. The example shows a cyclotron having two short hill sectors and two extended hill sectors. However, the disclosure applies as well to cyclotrons having more sectors, e.g. two short hill sectors and one extended hill sector, producing a magnetic field having a six-fold symmetry. Although shown as straight poles, the poles might as well be spiraled. The examples show a cyclotron having a two-fold symmetry, but the disclosure applies as well to designs departing from this two-fold symmetry.

Those skilled in the art will recognize that many variations are possible within the spirit and scope of the disclosure as defined in the following claims, and their equivalents, in which all terms are to be understood in their broadest possible sense unless otherwise indicated. As a consequence, all modifications and alterations will occur to others upon reading and understanding the previous description of the disclosure. In particular, dimensions, materials, and other parameters, given in the above description may vary depending on the needs of the application.

What is claimed is:

1. A cyclotron for accelerating charged particles around an axis, comprising:
    an electromagnet, including an upper pole and a lower pole, that is configured to produce a first magnetic field in the direction of said axis;
    a Dee electrode assembly and a counter Dee electrode assembly separated from each other by a gap and configured to accelerating said charged particles responsive to a predefined accelerating voltage; and
    a first ion source and a second ion source that form a pair of ion sources located in a central region of said cyclotron at a distance of said axis resulting in said charged particles emitted from said first ion source passing between said first and second ion sources after a path of half a turn, and radially outwards of the second ion source after a path of three half-turns, and the particles emitted from the second ion source pass between said second and said first ion source after a path of half a turn, and radially outwards of the first ion source after a path of three half turns,
    wherein said electromagnet, said Dee electrode assembly, and said pair of ion sources are configured to produce charged particles along paths in said cyclotron.

2. A cyclotron according to claim 1, wherein said upper pole and lower pole, said Dee electrode assembly, said counter Dee electrode assembly, and said pair of ion sources have a two-fold axis of symmetry.

3. A cyclotron according to claim 1, wherein
the upper pole and lower pole each include a short hill sector and an extended hill sector, the extended hill sectors having a larger radial extent than the short hill sectors and having a groove or plateau at an extended region, the groove or plateau following the shape of the path of charged particles resulting in the magnetic field decreasing at a shorter radial distance in the extended hill sectors than in the short hill sectors.

4. A cyclotron according to claim 3, wherein
a gap exists between the hill sectors of the upper pole and the lower pole, and
in the hill sectors, said upper and lower poles are shaped to make said gap constant along a path of said charged particles.

5. A cyclotron according to claim 3, further comprising:
a beam separator that is located radially inwards of a path of said charged particles having passed along said groove or plateau.

6. A cyclotron according to claim 3, wherein at least one of said short hill sectors or said long hill sectors have an azimuthal extent between 40° and 50°.

7. A cyclotron according to claim 6, wherein at least one of said short hill sectors or said long hill sectors have an azimuthal extent equal to 45°.

8. A cyclotron according to claim 3, wherein said ion sources are located at a radius and an azimuthal angle and oriented to cause the beam emitted therefrom to enter one of said long hill sectors at a radial distance of said groove or plateau.

9. A cyclotron according to claim 1, wherein the cyclotron is configured to:
produce two particle beams from said pair of ion sources simultaneously, and
direct said two beams to two targets.

10. A cyclotron according to claim 1, wherein the cyclotron is configured to:
produce one particle beam from one of said pair of ion sources, and
responsive to one of said pair of ion sources defaulting, produce one particle beam from the other of said pair of ion sources.

* * * * *